United States Patent
Song

(10) Patent No.: US 12,009,371 B2
(45) Date of Patent: Jun. 11, 2024

(54) DISPLAY DEVICE WITH TRANSPARENT ELECTRIC INSULATING HEAT CONDUCTIVE PROTECTIVE LAYER AND PRODUCTION METHOD THEREOF

(71) Applicants: Hefei BOE Joint Technology Co., Ltd., Anhui (CN); BOE TECHNOLOGY GROUP CO., LTD., Beijing (CN)

(72) Inventor: Lifang Song, Beijing (CN)

(73) Assignees: HEFEI BOE JOINT TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 519 days.

(21) Appl. No.: 17/263,612

(22) PCT Filed: Jun. 4, 2020

(86) PCT No.: PCT/CN2020/094384
§ 371 (c)(1),
(2) Date: Jan. 27, 2021

(87) PCT Pub. No.: WO2020/248893
PCT Pub. Date: Dec. 17, 2020

(65) Prior Publication Data
US 2021/0296370 A1    Sep. 23, 2021

(30) Foreign Application Priority Data
Jun. 13, 2019   (CN) .......................... 201910512675.7

(51) Int. Cl.
*H01L 27/12* (2006.01)
*H01L 21/02* (2006.01)
(Continued)

(52) U.S. Cl.
CPC .... *H01L 27/1248* (2013.01); *H01L 21/02164* (2013.01); *H01L 21/02282* (2013.01);
(Continued)

(58) Field of Classification Search
CPC ............. H01L 27/1248; H01L 27/1259; H01L 27/156; H01L 21/02164; H01L 21/02282;
(Continued)

(56) References Cited

U.S. PATENT DOCUMENTS 7,812,905 B2    10/2010  Sekiguchi et al.
8,064,003 B2    11/2011  Ohmi et al.
(Continued)

FOREIGN PATENT DOCUMENTS

CN    1886770 A    12/2006
CN    101149505 A    3/2008
(Continued)

OTHER PUBLICATIONS

Third Office Action, including Search Report, for Chinese Patent Application No. 201910512675.7, dated Mar. 14, 2022, 17 pages.
(Continued)

*Primary Examiner* — Eric W Jones
(74) *Attorney, Agent, or Firm* — Westman, Champlin & Koehler, P.A.

(57) ABSTRACT

A display apparatus (1) and a preparation method therefor. The display apparatus (1) is provided with: a base substrate (10); an organic planarizing layer (20) located on the base substrate (10); a transparent insulation heat-conduction protection layer (30) located at a side, away from the base substrate (10), of the organic planarizing layer (20); and a light-emitting element located at a side, away from the base substrate (10), of the transparent insulation-heat conduction-protection layer (30), wherein an orthographic projection, on the base substrate (10), of the light-emitting element at least
(Continued)

partially overlaps with an orthographic projection, on the base substrate (10), of the transparent insulation heat-conduction protection layer (30).

3 Claims, 3 Drawing Sheets

(51) Int. Cl.
- H01L 27/15 (2006.01)
- H10K 50/844 (2023.01)
- H10K 59/12 (2023.01)
- H10K 59/124 (2023.01)
- H10K 71/00 (2023.01)

(52) U.S. Cl.
CPC ........ *H01L 27/1259* (2013.01); *H01L 27/156* (2013.01); *H10K 50/844* (2023.02); *H10K 59/124* (2023.02); *H10K 71/00* (2023.02); *H10K 59/1201* (2023.02)

(58) Field of Classification Search
CPC .. H10K 71/00; H10K 59/124; H10K 59/1201; H10K 50/844
USPC .............................................. 257/40, 59, 72
See application file for complete search history.

(56) References Cited

U.S. PATENT DOCUMENTS

| | | | |
|---|---|---|---|
| 8,883,531 B2 | 11/2014 | Kim et al. | |
| 9,018,620 B2 | 4/2015 | Sawabe et al. | |
| 9,024,288 B2 | 5/2015 | Sun | |
| 9,853,251 B2 | 12/2017 | Gao | |
| 9,991,475 B2 | 6/2018 | Shen et al. | |
| 10,749,144 B2 | 8/2020 | Wang et al. | |
| 2007/0222933 A1 | 9/2007 | Ohmi | |
| 2008/0074588 A1 | 3/2008 | Sekiguchi et al. | |
| 2009/0286070 A1* | 11/2009 | Sueyoshi | C09D 7/67 428/404 |
| 2012/0228591 A1 | 9/2012 | Sawabe et al. | |
| 2014/0061595 A1 | 3/2014 | Kim et al. | |
| 2014/0091280 A1 | 4/2014 | Sun | |
| 2014/0159029 A1 | 6/2014 | Sawabe et al. | |
| 2014/0323589 A1* | 10/2014 | Lazar | C01B 33/155 264/52 |
| 2015/0069371 A1* | 3/2015 | Yamazaki | H10K 50/80 257/40 |
| 2016/0280879 A1* | 9/2016 | Brannum | D06M 11/48 |
| 2017/0084669 A1* | 3/2017 | Wolk | H10K 50/858 |
| 2017/0110681 A1 | 4/2017 | Shen et al. | |
| 2017/0237034 A1 | 8/2017 | Gao | |
| 2018/0090376 A1 | 3/2018 | Tan et al. | |
| 2020/0075882 A1 | 3/2020 | Wang et al. | |
| 2020/0181393 A1* | 6/2020 | Kawate | C08L 33/064 |

FOREIGN PATENT DOCUMENTS

| | | | | |
|---|---|---|---|---|
| CN | 102683606 | A | | 9/2012 |
| CN | 103570253 | A | | 2/2014 |
| CN | 103681741 | A | | 3/2014 |
| CN | 103730598 | A | | 4/2014 |
| CN | 103933912 | A | * | 7/2014 |
| CN | 104451525 | A | | 3/2015 |
| CN | 104659038 | A | | 5/2015 |
| CN | 102881654 | B | | 3/2016 |
| CN | 105575979 | A | | 5/2016 |
| CN | 105609536 | A | | 5/2016 |
| CN | 109148721 | A | | 1/2019 |
| CN | 109585510 | A | | 4/2019 |
| CN | 110208977 | A | | 9/2019 |
| JP | 2003007450 | A | | 1/2003 |

OTHER PUBLICATIONS

First Office Action, including Search Report, for Chinese Patent Application No. 201910512675.7, dated Jan. 28, 2021, 17 pages.
Second Office Action for Chinese Patent Application No. 201910512675.7, dated Aug. 20, 2021, 13 pages.

* cited by examiner

DISPLAY DEVICE WITH TRANSPARENT ELECTRIC INSULATING HEAT CONDUCTIVE PROTECTIVE LAYER AND PRODUCTION METHOD THEREOF

CROSS-REFERENCE TO RELATED APPLICATION

This application is a 371 National Stage application of International Application No. PCT/CN2020/094384, filed on Jun. 4, 2020, which published as WO 2020/248893 A1 on Dec. 17, 2020, not in English, and claims priority to Chinese Patent Application No. 201910512675.7, filed on Jun. 13, 2019, and is entitled "DISPLAY DEVICE AND PRODUCTION METHOD THEREFORE", the disclosures of which are incorporated herein by reference in their entireties.

TECHNICAL FIELD

The present disclosure relates to the field of display technology, and particularly to a display device and a production method thereof.

BACKGROUND ART

A planarization layer is generally provided in a display panel. Typically, a planarization layer is formed on a TFT substrate, and sequential films and layers, such as pixel electrodes and a light-emitting layer, are then formed on the planar surface of the planarization layer. Material for a planarization layer is generally a resin material.

Planarization layers are still to be improved for achieving better properties of display panels.

SUMMARY

In one aspect, this disclosure provides a display device, wherein the display device comprises:
 a base substrate;
 an organic planarization layer on the base substrate;
 a transparent electric insulating heat conductive protective layer located at a side of the organic planarization layer away from the base substrate; and
 a light-emitting element located at a side of the transparent electric insulating heat conductive protective layer away from the base substrate,
 wherein an orthographic projection of the light-emitting element on the base substrate and an orthographic projection of the transparent electric insulating heat conductive protective layer on the base substrate at least partially overlap.

Optionally, the orthographic projection of the light-emitting element on the base substrate is within the orthographic projection of the transparent electric insulating heat conductive protective layer on the base substrate.

Optionally, the transparent electric insulating heat conductive protective layer comprises a nano silica thin film layer.

Optionally, the transparent electric insulating heat conductive protective layer has a thickness of 1 μm-3 μm.

Optionally, the base substrate is a TFT array substrate, and the display device further comprises an anode layer, a pixel definition layer, a light-emitting layer, a cathode layer and an encapsulating layer;
 wherein
 the anode layer and the pixel definition layer are located at a side of the transparent electric insulating heat conductive protective layer away from the organic planarization layer;
 the anode layer is connected to a thin film transistor in the TFT array substrate via a through hole passing through the transparent electric insulating heat conductive protective layer and the organic planarization layer; and
 the light-emitting layer, the cathode layer and the encapsulating layer are provided sequentially at a side of the anode layer away from the transparent electric insulating heat conductive protective layer.

In another aspect, this disclosure provides a method for producing a display device, wherein the production method comprises
 providing a base substrate;
 covering the base substrate with an organic planarization layer;
 covering a side of the organic planarization layer away from the base substrate with a transparent electric insulating heat conductive protective layer; and
 forming a light-emitting element at a side of the transparent electric insulating heat conductive protective layer away from the base substrate;
 wherein an orthographic projection of the light-emitting element on the base substrate and an orthographic projection of the transparent electric insulating heat conductive protective layer on the base substrate at least partially overlap.

Optionally, the orthographic projection of the light-emitting element on the base substrate is within the orthographic projection of the transparent electric insulating heat conductive protective layer on the base substrate.

Optionally, said covering a side of the organic planarization layer away from the base substrate with a transparent electric insulating heat conductive protective layer comprises:
 producing a silica sol;
 applying the silica sol on the side of the organic planarization layer away from the base substrate; and
 heating and curing the silica sol, so as to obtain a nano silica thin film layer.

Optionally, said producing a silica sol comprises
 mixing ethyl orthosilicate with a solvent, then adding a basic catalyst and performing stirring;
 adding N, N-dimethyl formamide thereto, and obtaining the silica sol after stirring.

Optionally, the solvent comprises at least one of ethanol, ethoxyethanol, and isopropanol.

Optionally, the basic catalyst comprises a mixture of ammonia and water with a molar ratio of 0.001-0.002.

Optionally, a volume fraction of the N, N-dimethyl formamide in the silica sol is 25%-35%.

DESCRIPTION OF DRAWINGS

In order to describe the technical solutions in examples of this disclosure more clearly, drawings needed to be used in illustration for the examples will be described briefly below. Obviously, the drawings in the description below are only exemplary examples of this disclosure. For a person skilled in the art, other drawings may be obtained according to these drawings without inventive labor.

DESCRIPTION OF EMBODIMENTS

Figure 1:
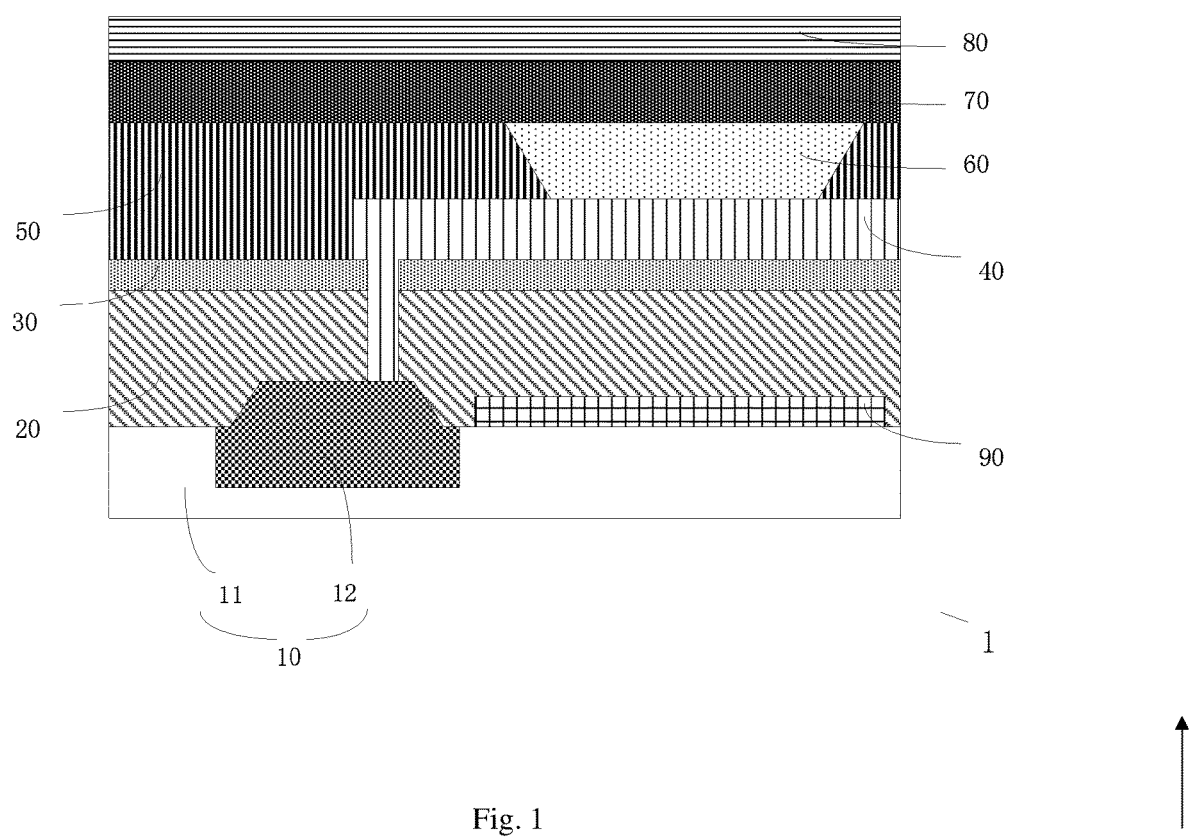
FIG. 1 is a schematic drawing of the structure of a display device provided in an example of this disclosure.

A planarization layer is generally provided in a display panel. Typically, a planarization layer is formed on a TFT substrate, and sequential films and layers, such as pixel electrodes and a light-emitting layer, are then formed on the planar surface of the planarization layer. Material for a planarization layer is generally a resin material. However, the resin material may shrink due to a too high temperature in the following long thermal processing procedures, or may shrink due to sputtering in the following sputtering processing. It will result in that the transmittance of blue light decreases when the light emitted from the light-emitting layer passes through the planarization layer in the display panel. For example, in a panel emitting light in the manner of using white light and a color filter, the resin material layer may result in that the intensity of blue light in the emergent light is low, the color temperature of white light is low, and color dots are yellowing.

The display device and method of this disclosure may at least partially solve the problems of low intensity of blue light, low color temperature of white light, and yellowing of the color dots.

In one embodiment, a display device comprises
a base substrate;
an organic planarization layer on the base substrate;
a transparent electric insulating heat conductive protective layer located at a side of the organic planarization layer away from the base substrate; and
a light-emitting element located at a side of the transparent electric insulating heat conductive protective layer away from the base substrate,
wherein an orthographic projection of the light-emitting element on the base substrate and an orthographic projection of the transparent electric insulating heat conductive protective layer on the base substrate at least partially overlap.

In the display device of this disclosure, the organic planarization layer is used for planarizing the base substrate. The base substrate may be any uneven substrate. A transparent electric insulating heat conductive protective layer is produced on the organic planarization layer, such as a resin material layer. The transparent electric insulating heat conductive protective layer has high heat conductivity, which may transfer heat effectively, reduce the influence of the processing procedures following the formation of the organic planarization layer on the resin material, so as to reduce the influence of various heat processing procedures on the transmittance of the organic planarization layer in the wavelength range of blue light, thereby reducing the loss of blue light in white light, increasing color temperature, and achieving improvement concerning the problem of yellowing of whit light. In addition to heat conductivity, the transparent electric insulating heat conductive protective layer also has transparence and insulating ability. The transparence ensures that there is not negative effect on the emergent light while the organic planarization layer is improved. The insulating ability ensures that electrodes of the light-emitting element may be then formed thereon.

The light-emitting element is located at a side of the transparent electric insulating heat conductive protective layer away from the base substrate, wherein an orthographic projection of the light-emitting element on the base substrate and an orthographic projection of the transparent electric insulating heat conductive protective layer on the base substrate at least partially overlap. The reason is that if the orthographic projections of the both do not overlap, the transparent electric insulating heat conductive protective layer cannot effectively protect a portion of the organic planarization layer, which portion is related to light emission. Preferably, the orthographic projection of the light-emitting element on the base substrate is within the orthographic projection of the transparent electric insulating heat conductive protective layer on the base substrate. Thus, all light emitted from the light-emitting element will not meet the problems of low intensity of blue light, low color temperature of white light, and yellowing of the color dots when passing through the organic planarization layer.

The transparent electric insulating heat conductive protective layer preferably comprises a nano silica thin film layer, which has good heat conductivity.

The transparent electric insulating heat conductive protective layer may have a thickness of 1 μm-3 μm. In this range, the heat conductivity, insulating ability and transparence thereof achieve good balance.

In an embodiment, a display device may comprise a TFT array substrate and an anode layer, a pixel definition layer, a light-emitting layer, a cathode layer and an encapsulating layer. The anode layer and the pixel definition layer may be located at a side of the transparent electric insulating heat conductive protective layer away from the organic planarization layer. The anode layer may be connected to a thin film transistor in the TFT array substrate via a through hole passing through the transparent electric insulating heat conductive protective layer and the organic planarization layer. The light-emitting layer, the cathode layer and the encapsulating layer may be provided sequentially at a side of the anode layer away from the transparent electric insulating heat conductive protective layer.

This disclosure further discloses a production method of a display device mentioned above, comprising:
providing a base substrate;
covering the base substrate with an organic planarization layer;
covering a side of the organic planarization layer away from the base substrate with a transparent electric insulating heat conductive protective layer; and
forming a light-emitting element at a side of the transparent electric insulating heat conductive protective layer away from the base substrate;
wherein an orthographic projection of the light-emitting element on the base substrate and an orthographic projection of the transparent electric insulating heat conductive protective layer on the base substrate at least partially overlap.

Preferably, the orthographic projection of the light-emitting element on the base substrate is within the orthographic projection of the transparent electric insulating heat conductive protective layer on the base substrate.

When the transparent electric insulating heat conductive protective layer is a nano silica thin film layer, it may be produced by following steps:
producing a silica sol;
applying the silica sol on the side of the organic planarization layer away from the base substrate; and
heating and curing the silica sol, so as to obtain a nano silica thin film layer.

In this manner, a desired transparent electric insulating heat conductive protective layer may be obtained on the organic planarization layer.

In an embodiment, producing a silica sol comprises:
mixing ethyl orthosilicate with a solvent, then adding a basic catalyst and performing stirring; and adding N, N-dimethyl formamide thereto, and obtaining the silica sol after stirring.

In this case, the solvent may comprise at least one of ethanol, ethoxyethanol, and isopropanol. The basic catalyst may comprise a mixture of ammonia and water with a molar ratio of 0.001-0.002. In the silica sol, a volume fraction of the N, N-dimethyl formamide may be 25%-35%.

The materials and parameters are beneficial for obtaining the desired transparent electric insulating heat conductive protective layer.

The technical solutions in examples of this disclosure will be clearly and fully described by incorporating drawings of this disclosure. Obviously, the examples described only a part of examples of this disclosure, but not all examples. On the basis of the examples in this disclosure, all other examples obtained by a person skilled in the art without inventive labor belong to the protection scope of this disclosure.

Example 1

Referring to FIG. 1, a display device 1 is shown and comprises:

a base substrate 10, such as a TFT (a thin film transistor) array substrate, which comprises a base 11 and an uneven portion 12, such as a TFT; an organic planarization layer 20 covering the base substrate 10; and a transparent electric insulating heat conductive protective layer 30 located at a side of the organic planarization layer 20 away from the base substrate 10. The transparent electric insulating heat conductive protective layer 30 has heat conductivity, transparence and insulating ability.

In an example of this disclosure, the base substrate 10 is a TFT glass substrate. The organic planarization layer 20 is of resin material.

In an example of this disclosure, the transparent electric insulating heat conductive protective layer 30 comprises a nano silica thin film layer. In this case, the nano silica thin film layer may be produced by a sol-gel method.

In an example of this disclosure, the transparent electric insulating heat conductive protective layer 30 has good heat conductivity, transparence and insulating ability.

In this case, the protective layer 30 has a thickness of 1 µm-3 µm.

In this case, this display device further comprises an anode layer 40, a pixel definition layer 50, a light-emitting layer 60, a cathode layer 70 and an encapsulating layer 80.

The anode layer 40 and the pixel definition layer 50 are formed at a side of the transparent electric insulating heat conductive protective layer 30 away from the organic planarization layer 20.

The anode layer 40 is connected to the thin film transistor 12 in the TFT array substrate 10 via the though hole passing through the transparent electric insulating heat conductive protective layer 30 and through the organic planarization layer 20.

The light-emitting layer 60, the cathode layer 70 and the encapsulating layer 80 are provided sequentially at a side of the anode layer 40 away from the transparent electric insulating heat conductive protective layer 30.

This display device further comprises a color filter layer 90.

In an example of this disclosure, the material of the anode layer 40 is indium tin oxide (ITO).

This example is a bottom emitting display device. Light emitted from the light-emitting layer 60 passes through the transparent anode layer 40, the transparent electric insulating heat conductive protective layer 30, the planarization layer 20, the color filter layer 90, and a base 11 and emits out. The transparent electric insulating heat conductive protective layer 30 is in the light emission path of the display device 1.

In an example of this disclosure, a transparent electric insulating heat conductive protective layer is formed to cover the organic planarization layer. The protective layer may effectively protect the organic planarization layer, prevent occurrence of deformation of the organic planarization layer in the following processing procedures, reduces loss of blue light in white light in the organic planarization layer, increases color temperature, improves white light, and improves the light emission quality of the display device.

Example II

Figure 2:
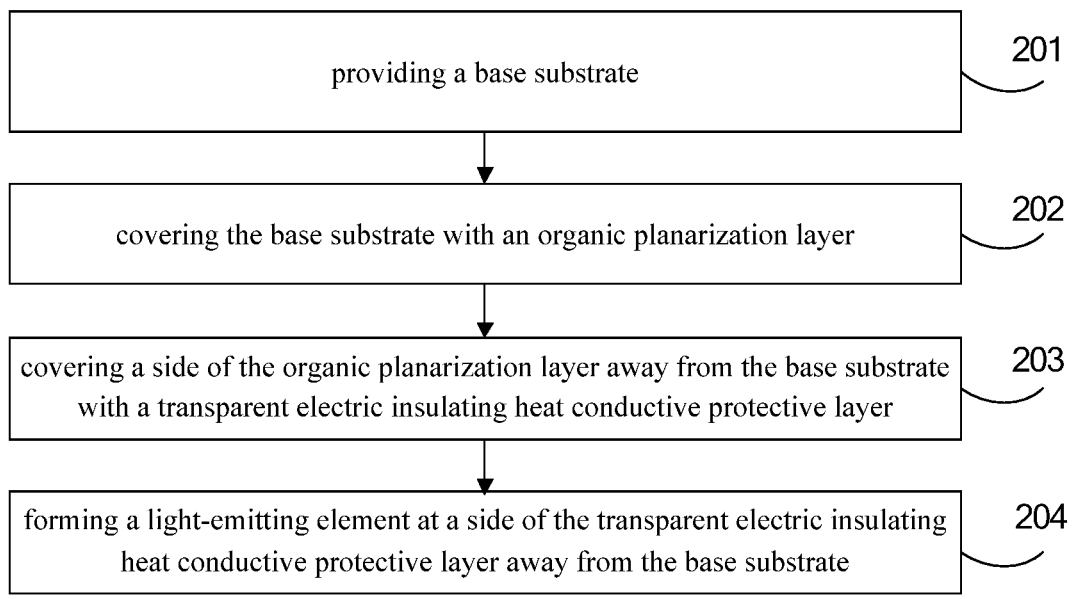
FIG. 2 is a flow chart of a production method of a display device provided in an example of this disclosure.

Referring to FIG. 2, a flow chart of a production method of a display device provided in an example of this disclosure is shown. This production method particularly comprises following steps:

Step 201: providing a base substrate;

Step 202: covering the base substrate with an organic planarization layer;

Step 203: covering a side of the organic planarization layer away from the base substrate with a transparent electric insulating heat conductive protective layer;

Step 204: forming a light-emitting element at a side of the transparent electric insulating heat conductive protective layer away from the base substrate.

In an example of this disclosure, the base substrate comprises a TFT glass substrate.

In an example of this disclosure, material for the organic planarization layer comprises a resin material.

Figure 3:
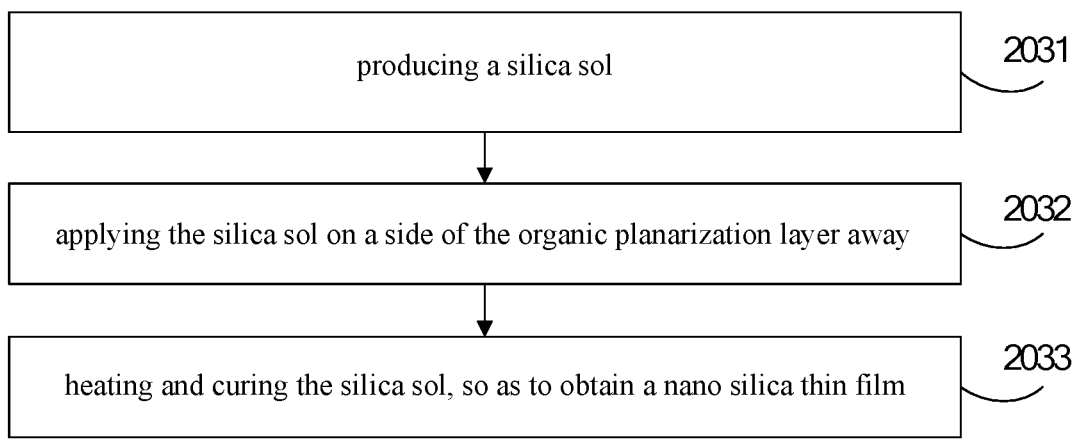
FIG. 3 is a flow chart of a production method of a silica thin film layer provided in an example of this disclosure.

In an example of this disclosure, referring to FIG. 3, Step 203 comprises:

Step 2031: producing a silica sol;

Step 2032: applying the silica sol on a side of the organic planarization layer away from the base substrate; and Step 2033: heating and curing the silica sol, so as to obtain a nano silica thin film layer.

In this case, the range of the temperature of the heating and curing is 180° C.-220° C.

Figure 4:
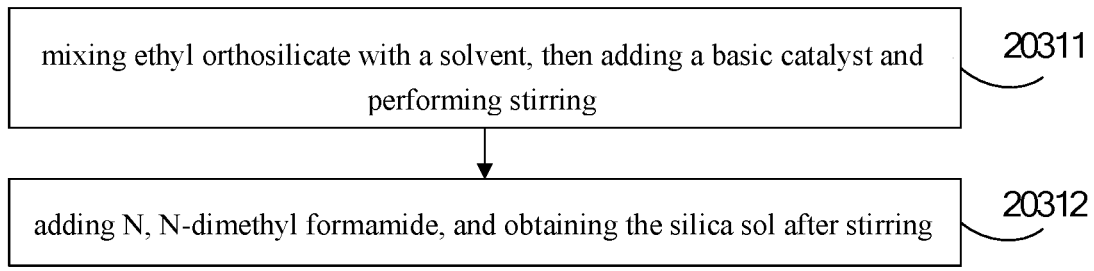
FIG. 4 is a flow chart of a production method of a silica sol provided in an example of this disclosure.

In an example of this disclosure, referring to FIG. 4, the producing a silica sol comprises:

Step 20311: mixing ethyl orthosilicate with a solvent, then adding a basic catalyst and performing stirring;

Step 20312: adding N, N-dimethyl formamide thereto, and obtaining the silica sol after stirring.

In this case, a ratio of ethyl orthosilicate to the solvent is a molar ratio of 1:2.5-3.5. The method for mixing ethyl orthosilicate and the solvent comprises stirring and blending them for 50 min-100 min, preferably 60 min, by Magnetic stirring, until uniform mixing is achieved.

In an example of this disclosure, after N, N-dimethyl formamide is added, the magnetic stirring may be continued, until uniform mixing is achieved.

The solvent comprises at least one of ethanol, ethoxyethanol, and isopropanol.

The basic catalyst comprises a mixture of ammonia and water with a molar ratio of 0.001-0.002.

The second preset ratio is a volume fraction including 25%-35%.

In this case, optionally, a volume fraction of N, N-dimethyl formamide in the total volume of the silica sol (comprising volumes of the ethyl orthosilicate, the solvent, the basic catalyst and N, N-dimethyl formamide) is 25%-35%, preferably 30%.

In an example of this disclosure, after the transparent electric insulating heat conductive protective layer is produced at the side of the organic planarization layer away from the base substrate, the method further comprises: producing an anode layer and a pixel definition layer at the side of the transparent electric insulating heat conductive protective layer away from the organic planarization layer; connecting an anode layer to a thin film transistor in the TFT array substrate via a through hole passing through the transparent electric insulating heat conductive protective layer and through the organic planarization layer; and producing sequentially a light-emitting layer, a cathode layer and an encapsulating layer at the side of the anode layer way from the protective layer. There may be heat processing step and/or sputtering step in production of the anode layer, the pixel definition layer, the light-emitting layer, the cathode layer and/or an encapsulating layer. However, these steps do not cause deformation of the planarization layer and loss of blue light in the light emission of the display.

In examples of this disclosure, the transparent electric insulating heat conductive protective layer covering the organic planarization layer may effectively protect the organic planarization layer, prevent occurrence of deformation of the organic planarization layer in the following processing procedures, reduces loss of blue light in white light in the organic planarization layer, increases color temperature, improves white light, and improves the light emission quality of the display device.

A person skilled in the art may clearly know that specific working processes of the systems, devices and units mentioned above may refer to corresponding processes in the above-mentioned examples of the method for convenience and concision, and verbose words are omitted herein.

The above mentioned examples are merely some preferred examples of this disclosure and are not used to limit this disclosure. All modifications, equivalent replacements and improvements within the spirit and principle of this disclosure should be included in the protection scope of this disclosure.

The above mentioned embodiments are only specific embodiments of this disclosure. The protection scope of this disclosure is not limited thereto. Any changes or modifications that may be envisaged by a person skilled in the art easily in the technical range disclosed by this disclosure are involved in the protection scope of this disclosure. Therefore, the protection scope of this disclosure is the protection scope of the claims.

What is claimed is:

1. A production method for a display device, wherein the production method comprises
   providing a base substrate;
   covering the base substrate with an organic planarization layer;
   covering a side of the organic planarization layer away from the base substrate with a transparent electric insulating heat conductive protective layer against deformation due to sputtering; and
   forming a light-emitting element at a side of the transparent electric insulating heat conductive protective layer against deformation due to sputtering away from the base substrate;
   wherein an orthographic projection of the light-emitting element on the base substrate and an orthographic projection of the transparent electric insulating heat conductive protective layer against deformation due to sputtering on the base substrate at least partially overlap,
   wherein said covering a side of the organic planarization layer away from the base substrate with a transparent electric insulating heat conductive protective layer against deformation due to sputtering comprises:
   producing a silica sol;
   applying the silica sol on a side of the organic planarization layer away from the base substrate;
   heating and curing the silica sol, so as to obtain a nano silica thin film layer,
   wherein said producing a silica sol comprises
   mixing ethyl orthosilicate with a solvent, then adding a basic catalyst and performing stirring;
   adding N, N-dimethyl formamide, and obtaining the silica sol after stirring,
   wherein the basic catalyst comprises a mixture of ammonia and water with a molar ratio of 0.001-0.002,
   wherein a volume fraction of the N, N-dimethyl formamide in the silica sol is 25%-35%.

2. The production method according to claim 1, wherein an orthographic projection of the light-emitting element on the base substrate is within an orthographic projection of the transparent electric insulating heat conductive protective layer against deformation due to sputtering on the base substrate.

3. The production method according to claim 1, wherein the solvent comprises at least one of ethanol, ethoxyethanol, and isopropanol.

* * * * *